(12) United States Patent
Shuvalov

(10) Patent No.: US 9,729,345 B2
(45) Date of Patent: Aug. 8, 2017

(54) NOISE SUPPRESSION CIRCUIT FOR A SWITCHABLE TRANSISTOR

(71) Applicant: FREESCALE SEMICONDUCTOR, INC., Austin, TX (US)

(72) Inventor: Denis Sergeevich Shuvalov, Zelenograd (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/987,024

(22) Filed: Jan. 4, 2016

(65) Prior Publication Data
US 2017/0005650 A1 Jan. 5, 2017

(30) Foreign Application Priority Data

Jun. 30, 2015 (RU) ................ 2015125997

(51) Int. Cl.
H03K 17/687 (2006.01)
H04L 12/46 (2006.01)
H04L 12/10 (2006.01)
H04L 12/403 (2006.01)
H03K 17/16 (2006.01)

(52) U.S. Cl.
CPC ........... *H04L 12/46* (2013.01); *H03K 17/166* (2013.01); *H04L 12/10* (2013.01); *H04L 12/403* (2013.01)

(58) Field of Classification Search
USPC ................ 327/427, 430–434, 384
See application file for complete search history.

(56) References Cited

U.S. PATENT DOCUMENTS

| 6,664,821 | B2 | 12/2003 | De Haas et al. |
| 7,005,879 | B1* | 2/2006 | Robertazzi ......... G01R 31/2879 324/73.1 |
| 7,940,076 | B2 | 5/2011 | Chimakurthy et al. |
| 8,154,263 | B1* | 4/2012 | Shi ..................... G05F 1/575 323/269 |
| 8,829,950 | B2 | 9/2014 | Shen et al. |
| 2010/0166085 | A1 | 7/2010 | Sicard |

FOREIGN PATENT DOCUMENTS

EP 1887694 B1 1/2010

* cited by examiner

*Primary Examiner* — An Luu

(57) ABSTRACT

A noise suppression circuit comprises a switchable transistor and an amplifier having a first amplifier input terminal electrically coupled to an output terminal of the switchable transistor for sensing a voltage thereat, and an amplifier output terminal electrically coupled to a control terminal of the switchable transistor for outputting a control voltage thereto. The amplifier is configured, based on the sensed voltage and a transition mode threshold voltage of the switchable transistor which defines a boundary between operation modes of the switchable transistor, to set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor the resistive path is substantially interrupted.

18 Claims, 4 Drawing Sheets

NOISE SUPPRESSION CIRCUIT FOR A SWITCHABLE TRANSISTOR

CROSS REFERENCE TO RELATED APPLICATION(S)

The present application claims priority to Russian Patent Application No. RU 2015125997, entitled "A NOISE SUPPRESSION CIRCUIT FOR A SWITCHABLE TRANSISTOR," filed on Jun. 30, 2015, the entirety of which is herein incorporated by reference.

FIELD OF THE INVENTION

This invention relates to a noise suppression circuit for a switchable transistor, a local interconnect network bus transceiver, an integrated circuit, an integrated circuit device and an automotive vehicle incorporating the noise suppression circuit.

BACKGROUND OF THE INVENTION

A Local interconnect network (LIN) bus is typically used in automotive applications and provides a concept of a single master and multiple slaves connected to a single bus wire. The master and the slaves typically include LIN transceivers capable of driving the bus into a dominant or recessive state. When a recessive voltage level corresponding to a relatively high positive voltage close to a positive supply voltage is applied to the bus wire, the LIN bus is said to be in recessive state. When a dominant voltage level corresponding to a relatively low positive voltage close to a ground level voltage is applied to the bus wire in response to a data signal, the LIN bus is said to be in dominant state. The master and the slaves have a built-in line driver for pulling up the bus wire to the recessive voltage level and pulling down the bus wire voltage to the dominant voltage level.

With increasing integration, LIN transceivers may be embedded in chips offering other functionalities than only LIN bus driving. Said chips may for example include switching circuitry such as switched-mode power supplies, DC-DC converters, high power drivers for switching loads, such as motors, transformers, rotor coils of electrical generator, heaters, lamps, ballast and large scale logic circuits that generate switching noise. This generated switching noise can be coupled through common ground and injected to the LIN bus via the built in driver when the LIN bus is in dominant state, i.e. when a low impedance path exists between ground and the LIN bus via the built in driver. Disturbances in the LIN bus can cause the LIN bus to emit electro-magnetic noise radiation, which can negatively impact the performance of other circuits susceptible to electro-magnetic interference.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the figures, elements, which correspond to elements already described, may have the same reference numerals.

DETAILED DESCRIPTION OF THE PREFERRED EMBODIMENTS

LIN (Local Interconnect Network) bus transceivers may be used to control various components connected to a bus wire in vehicles such as cars, airplanes, trucks, etc. Examples of vehicle components that can be controlled by LIN transceivers are alternators, light sensors, electric sun roofs, cruise controls, electric mirrors, door windows, seat control switches, door locks and other components present in the vehicles for a variety of purposes.

LIN bus transceivers are typically arranged in a LIN network comprising one master and typically one or more slaves. All messages are initiated by the master with at least one slave replying to a given message identifier sent by the master. The master and the slaves typically include microcontrollers that generate all data by software and are connected to the LIN network via the LIN bus transceivers. The LIN transceiver typically works as a voltage level shifter driving a bus to a relatively high state, i.e. to a voltage close to the supply voltage generated for example by the battery of the vehicle, in a so called recessive state, and to relatively low state, i.e. to a voltage close to the ground, in a so-called dominant state.

Noise can be generated by for example switching circuitry integrated with the LIN bus transceiver. This noise can be coupled to the bus via the LIN bus transceiver and the common ground of the LIN bus transceiver and the switching circuitry when the LIN bus transceiver drives the bus in dominant state. The noise can radiate via the bus, which is a long wire acting as an antenna, to other circuits in the vehicle degrading the performance of said other circuits. Herewith it is described an inventive noise suppression circuit embedded inside the LIN bus transceiver which suppresses this noise inside the LIN bus transceiver when the LIN bus transceiver drives the LIN bus in dominant state without the need of separating the ground of the LIN bus transceiver from the ground of the switching circuitry.

Figure 1:
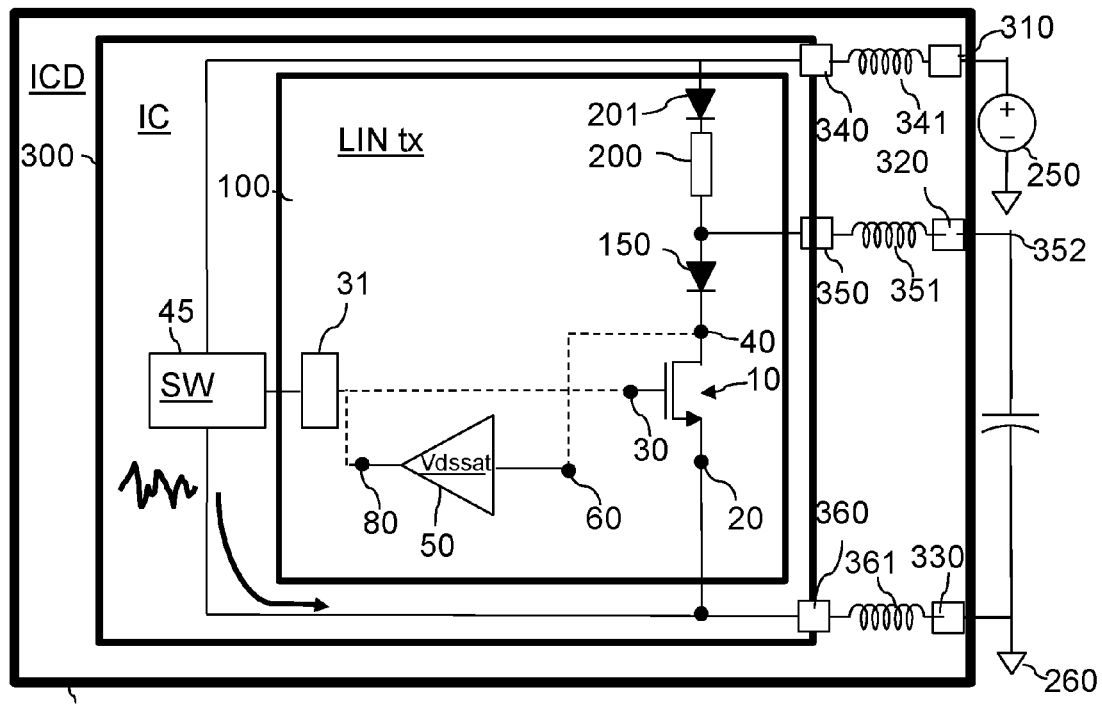
FIG. 1 schematically shows an equivalent circuit of an integrated circuit device, FIG. 2 schematically shows an equivalent circuit of a first example of a local interconnect bus transceiver, FIG. 3 schematically shows an equivalent circuit of a second example of a local interconnect bus transceiver, FIG. 4 schematically shows an equivalent circuit of a third example of a local interconnect bus transceiver, FIG. 5 schematically shows an equivalent circuit of a fourth example of a local interconnect bus transceiver, FIG. 6 schematically shows an equivalent circuit of a fifth example of a local interconnect bus transceiver, FIG. 7 schematically shows an automotive vehicle.

FIG. 1 schematically shows an equivalent circuit of an integrated circuit device 400 (ICD) according to an embodiment of the present invention. The integrated circuit device 400 can include an integrated circuit 300 (IC) embedded for example in an integrated circuit package. The integrated circuit 300 can include a local interconnect network (LIN) bus transceiver 100 (LINtx) and one or more switching circuits 45 (SW).

The integrated circuit device 400 has a first electrically conductive terminal 310, a second electrically conductive terminal 320 and a third electrically conductive terminal 330 which can be used to electrically connect the integrated circuit device 400 to external circuitry. The first electrically conductive terminal 310 can be connected to a positive terminal of a battery 250 external to the integrated circuit device 400 to supply the LIN transceiver 100 and switching circuits 45 with a battery voltage generated therefrom. The second electrically conductive terminal 320 can be connected to a LIN bus 352 to for example connect the LIN transceiver 100 to a LIN network. The third electrically conductive terminal 330 can be connected to the ground 260.

The first electrically conductive terminal 310, the second electrically conductive terminal 320 and the third electrically conductive terminal 330 are electrically coupled to respective integrated circuit terminals 340, 350 and 360 via associated electrically conductive elements 341, 351, and 361.

The electrically conductive elements can be bondwires, metal lines, metal striplines, or any suitable electrically conductive connection between the internal integrated circuit terminals 340, 350 and 360 and the external integrated circuit terminals 310, 320 and 330, which are for example the terminals of a package containing the integrated circuit 300. Such electrically conductive elements have inherently a parasitic inductance that is schematically shown in FIG. 1 with an inductor. The one or more switching circuit 45 can produce switching current that flows via the common ground terminal.

The LIN transceiver 100 drives the LIN bus 352. The LIN transceiver 100 includes a switchable transistor 10 and a drive circuit 31 configured to drive the switchable transistor 10 to either a recessive or a dominant state on the LIN bus 352. The switchable transistor 10 has a transistor control terminal 30, a transistor output terminal 40 and a transistor reference terminal 20. The output terminal 40 is electrically coupled to the LIN bus 352 for driving the LIN bus 352. The LIN transceiver 100 can further include a first diode 150 and series arrangement of a resistor 200 with a second diode 201. Diodes 150, 201 and the resistor 200 are arranged in series with the switchable transistor 10. The diode 150 has a cathode electrically connected to the transistor output terminal 40 and an anode electrically coupled to a first terminal of the resistor 200 and to the LIN bus 352 via the associated electrically conductive element 351. A second terminal of the resistor 200 can be electrically coupled via the diode 201 to a positive terminal of a battery 250.

The resistor 200 is used as a pull-up resistor to pull-up the LIN bus 352 to the voltage supplied by the battery 250. The resistor 200 may have a typical value of 30 kOhm. The diode 150 can be used to block any currents flowing from the transistor reference terminal 20 to the LIN bus 352 via a parasitic backdiode (not shown) of the switchable transistor 10. The battery 250 can be the battery of a vehicle in which the LIN network is installed.

The switchable transistor 10 drawn in FIG. 1 is a Metal Oxide-Semiconductor Field Effect Transistor (MOSFET) in which case the control terminal 40 is a gate terminal, the output terminal 40 is a drain terminal and the reference terminal 20 is a source terminal. As shown in FIG. 1, the source terminal 20 of the MOSFET 10 is, in the example shown, electrically connected to ground 260 via the electrically conductive element 361. The source terminal 20 is a common reference terminal for the gate 30 and the drain 40 and the MOSFET is said to be configured in a common source topology.

However, the switchable transistor 10 may be any other type of transistor suitable for the specific implementation. For example, the switchable transistor maybe a Metal-Semiconductor Field Effect transistor (MESFET), a junction effect field effect transistor (JFET), a High electron mobility transistor (HEMT), an Insulated Gate Field effect Transistor (IGFET), a hetero-junction bipolar transistor (HBJT), or a junction bipolar transistor (BJT). In bipolar transistors the control terminal corresponds to a base terminal, the output terminal corresponds to a collector terminal and the reference terminal corresponds to an emitter terminal.

The drive circuit 31 can be a conventional drive circuit used in similar applications. For example the drive circuit 31 can be a level shifter consisting of a lower switch coupled between the transistor control terminal 30 and the transistor reference terminal 20 and an upper switch coupled between the transistor control terminal 30 and a positive supply (for example derived from the battery voltage). The lower switch drives, when on, the switchable transistor 10 to an on state and the upper transistor drives, when on, or off when needed. The lower and upper switches may not be simultaneously switched on.

The one or more switching circuits 45 have a reference terminal electrically connected to the transistor reference terminal 20. The one or more switching circuits 45 can be supplied by the battery 250 via a supply terminal electrically connected to the positive terminal of the battery 250.

The switching circuits 45 may for example consist of DC-DC converter, switched-mode power supplies, high power drivers for switching loads or large scale logic circuits as a part of the integrated circuit 300 with the LIN bus transceiver 100. The switching circuits 45 typically have a pulsed current consumption, which, due to the parasitic inductance associated with the electrically conductive connection between the electrically conductive reference terminals 360 and 330, generates switching noise voltage on the reference terminal 20 with respect to the reference terminal 330, corresponding to the ground reference of the LIN bus 352. This switching noise voltage propagates to the LIN bus 352 with some attenuation, which corresponds to a ratio between the AC (Alternating Current) impedance of the LIN bus 352 and AC impedance of the switchable transistor 10 at different frequencies at which the switching noise is generated. When the drive circuit 31 drives the LIN bus 352 in dominant state, the alternating current (AC) impedance of the switchable transistor 10 is substantially at a minimum level thereby more switching noise voltage can propagate to the LIN bus 352.

The LIN transceiver 100 includes a circuit that supress this switching noise voltage from the LIN bus in the desired frequency range of the switching noise. The circuit will be herewith below described in detail.

The LIN transceiver 100 includes an amplifier 50 having a first amplifier input terminal 60 electrically coupled to the transistor output terminal 40 as indicated by the dashed line drawn in FIG. 1 between the amplifier input terminal 60 and the transistor output terminal 40, and an amplifier output terminal 80 electrically coupled to the transistor control terminal 30 as indicated by the dashed line drawn in FIG. 1 between the amplifier output terminal 80 and the transistor control terminal 30. The amplifier input terminal 60 is configured to sense a voltage at the transistor output terminal 40. The amplifier output terminal 80 is configured to output a control voltage to the control terminal 30 of the switchable transistor 10. When the drive circuit 31 drives the switchable transistor 10 in dominant state, the amplifier 50 is configured, based on the sensed voltage and a transition mode threshold voltage Vdssat, to set a voltage at the transistor output terminal 40 equal to at least the transition mode threshold voltage Vdssat. By configuring the amplifier in this manner, for frequencies of the switching noise below or corresponding to the switching frequency of the switchable transistor 10, a resistive path is provided between the transistor output terminal 40 and the transistor reference terminal 20 and for frequencies of the switching noise above the switching frequency of the switchable transistor 10 the resistive path between the transistor output terminal 40 and the transistor reference terminal 20 is substantially interrupted.

The transition mode threshold voltage defines a transition between operational modes of the switchable transistor 10.

In known LIN bus transceivers, when the LIN bus transceiver is driven in dominant state, the transistor 10 is typically driven in saturation mode, or for a MOS transistor in a so-called triode region. In case of a MOSFET, it is common convention that when the gate to source voltage Vgs is greater than a physical threshold voltage Vth of the MOSFET, and the drain to source voltage Vds is smaller than the gate to source voltage Vgs minus the physical threshold voltage Vth, the MOSFET is operating in triode region. Translated into formulas, the conditions for a MOSFET to operate in triode region are the following:

$$Vgs > Vth \quad (1)$$

$$Vds < (Vgs - Vth) = Vdssat \quad (2),$$

wherein Vth is the transistor physical threshold voltage and Vdssat is the transition mode threshold voltage defining the boundary between saturation and triode regions in the MOSFET 10. In other words, Vdssat is a minimum drain to source voltage Vds voltage required to keep the MOSFET transistor in saturation region.

In triode region, the switchable transistor 10 behaves as a low ohmic resistor for a broad range of switching noise frequencies. Thus, attenuation of the switching noise, generated by the one or more switching circuits 45 and propagating via reference terminal 20 and the switchable transistor 10 to the LIN bus 352, is poor. In known art this problem is typically solved by separating the reference terminal of the switchable transistor 10 from the reference terminal of the one or more switching circuits 45.

In the embodiment according to the invention of FIG. 1, the amplifier 50 sets the voltage at the transistor output terminal 40 as close as possible to ground 260 but not below the transition mode threshold voltage Vdssat in order to keep the switchable transistor 10 away from operating in the triode region. The amplifier sets the voltage at the transistor output terminal 40 such that the switchable transistor 10 can operate in saturation region. In saturation region, the MOSFET 10 is biased as follows:

$$Vgs > Vth \quad (3)$$

$$Vds > (Vgs - Vth) = Vdssat \quad (4).$$

In saturation region, the switchable transistor 10 has substantially high AC output impedance until relatively high switching noise frequencies. In saturation region, at relatively high switching noise frequencies, propagation of switching noise to the LIN bus 352 is effectively suppressed due to high output impedance of the transistor 10. The amplifier 50 and the switchable transistor 10 form a feedback loop that is configured to regulate voltage at the output terminal 40 of the switchable transistor 10 such that the transistor 10 operates in the MOS saturation region with high output impedance when the drive circuit 31 drives the switchable transistor 10 in dominant state. Expectedly, said feedback loop decreases effective output impedance of the switchable transistor 10 by about a factor of open loop gain. As it is known from feedback system theory, if a system has a dominant frequency pole, the open loop gain is substantially maximum at low frequencies below the dominant frequency pole and at frequencies above dominant frequency pole the open loop gain decreases with frequency.

When the loop is closed, at low frequencies and DC, the effective AC output impedance of the switchable transistor 10 is relatively low, but at high frequencies the effective AC output impedance is high. Effective switching noise suppression can be obtained by having a dominant pole at lowest possible frequency. However, a trade-off can be found such that by placing the dominant pole at sufficiently high frequency relative to the maximum switching frequency of the switchable transistor 10, the feedback loop has negligible effects on the operation of the LIN transceiver 100 at its switching frequency.

It is to be noted that the feedback loop, formed by the amplifier 50 and the switchable transistor 10, as described with reference to FIG. 1, is intended to be used when the LIN transceiver 100 drives a dominant state on the LIN bus 352, i.e. when the switchable transistor 10 is switched on by the drive circuit 31 and a low direct current path exists between the transistor output terminal 40 and the transistor reference terminal 20.

When the LIN bus transceiver 100 is operating in recessive state, the feedback loop, as described with reference to FIG. 1, is not active and the drive circuit 31 can switch off the switchable transistor 10.

The LIN bus transceiver circuit according to the present invention can be implemented in various topologies suitable for the specific implementation.

Figure 2:
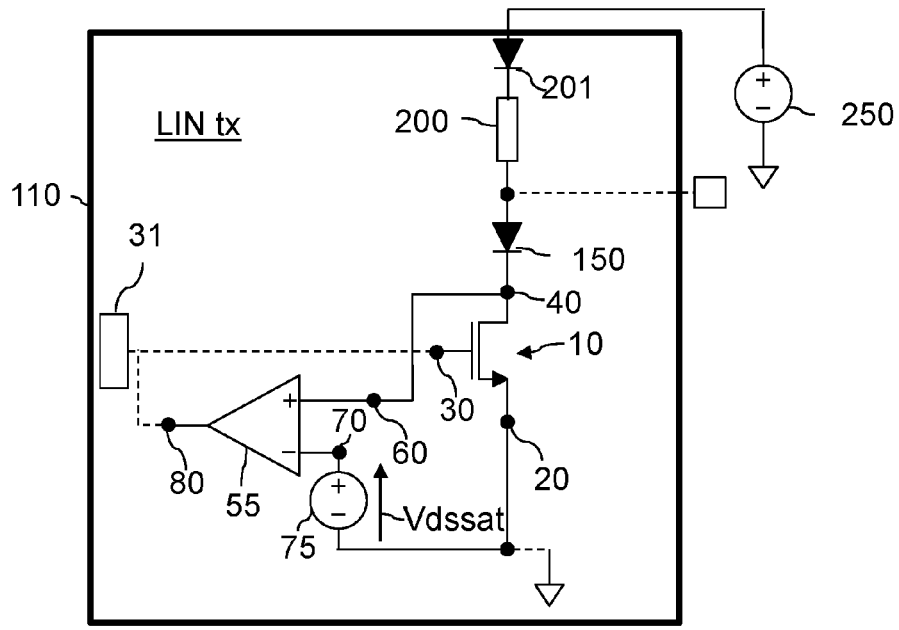

For example, FIG. 2 shows an equivalent circuit of a first example of a LIN bus transceiver 110 (LINtx). Elements of the FIG. 2 having the same reference number of FIG. 1 will not be herein below described.

The LIN bus transceiver 110 differs from the LIN bus transceiver 100 in that it includes a first reference voltage source 75 and an amplifier 55. The first reference voltage source 75 is configured to generate the transition mode threshold voltage Vdssat. The amplifier 55 has a first amplifier input 60, a second amplifier input 70 and an amplifier output 80. The first amplifier input 60 is directly electrically connected to the transistor output terminal 40. The second amplifier input terminal 70 is electrically coupled to the transistor reference terminal 20 via the first reference voltage source 75. The transistor output terminal 80 is electrically coupled to the transistor control terminal 30.

In this example the circuit including the amplifier 55 and the switchable transistor 10 forms a negative feedback loop. The amplifier 55 may be a differential amplifier of which the first amplifier input 60 is a non-inverting first input and the second amplifier input 70 is an inverting second input. The negative feedback loop is configured and regulates the voltage at the transistor output terminal 40 to Vdssat, when the switchable transistor 10 is driven by drive circuit 31 in dominant state, such that the switchable transistor 10 has relatively high AC output impedance for switching noise frequencies above the switching frequency of the switchable transistor 10.

In the example shown in FIG. 2, the transition mode threshold voltage Vdssat may be generated with reference to the transistor reference terminal 20. The circuit shown in FIG. 2 has the advantage that Vdssat=(Vgs−Vth) can be easily generated from known physical parameters, such as the transistor physical threshold voltage Vth, of the switchable transistor 10.

Figure 3:
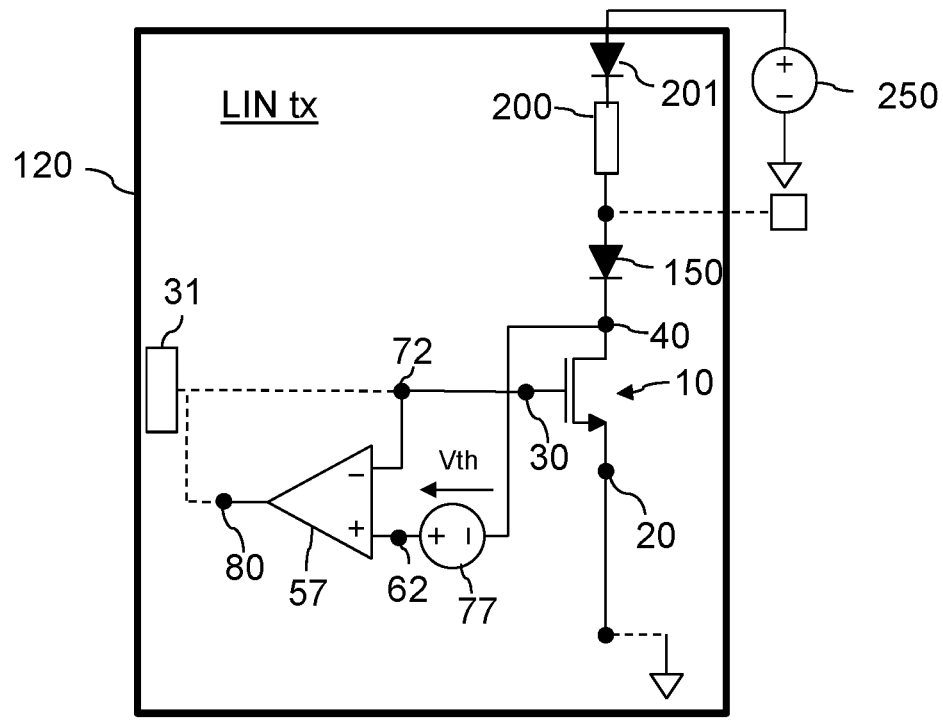

FIG. 3 shows an equivalent circuit of a second alternative example of a LIN bus transceiver 120.

The LIN bus transceiver 120 differs from the LIN bus transceiver 110 in that it includes a second reference voltage source 77 and an amplifier 57. The amplifier 57 has a first amplifier input 62 and a second amplifier input 72. The first amplifier input 62 is electrically coupled to the transistor output terminal 40 via the second reference voltage source 77. The second amplifier input 72 is directly electrically connected to the transistor control terminal 30.

The circuit which includes the amplifier 57, the switchable transistor 10 and the second reference voltage source 77 forms a negative feedback loop. The amplifier 57 may be a differential amplifier of which the first amplifier input 62 is a non-inverting first input and the second amplifier input 72 is an inverting second input. The loop prevents that the switchable transistor 10 transits from an operating mode wherein the AC output impedance of the switchable transistor 10 is relatively high (saturation region in case of a MOSFET) to another operating mode wherein the output impedance of the switchable transistor 10 is relatively low (triode region in case of a MOSFET).

The second reference voltage source 77 is configured to generate a voltage substantially equal to the physical threshold voltage Vth of the switchable transistor 10. The voltage generated by the second reference voltage source 77 can be lower than the physical threshold voltage Vth, such that the condition (4) can be satisfied independently from the operating temperature, dimensions of switchable transistor 10 and current flowing through the switchable transistor 10.

The negative feedback loop is configured and regulates the voltage at the transistor output terminal 40 to Vdssat= (Vgs−Vth), when the switchable transistor 10 is driven by drive circuit 31 in dominant state, such that the switchable transistor 10 has relatively high AC output impedance for switching noise frequencies above the switching frequency of the switchable transistor 10.

The amplifier 57 is configured to set the voltage at the output terminal 40 to a voltage above the transition mode threshold voltage Vdssat such that for frequencies above the maximum operating switching frequency of the switchable transistor 10 the DC resistive current path formed between the transistor output terminal 40 and the transistor reference terminal 20 is interrupted.

The threshold voltage Vth of the MOSFET 10 is the minimum gate to source voltage Vgs needed to create a conducting path between the source 20 and drain 40 of the MOSFET 10.

Figure 4:
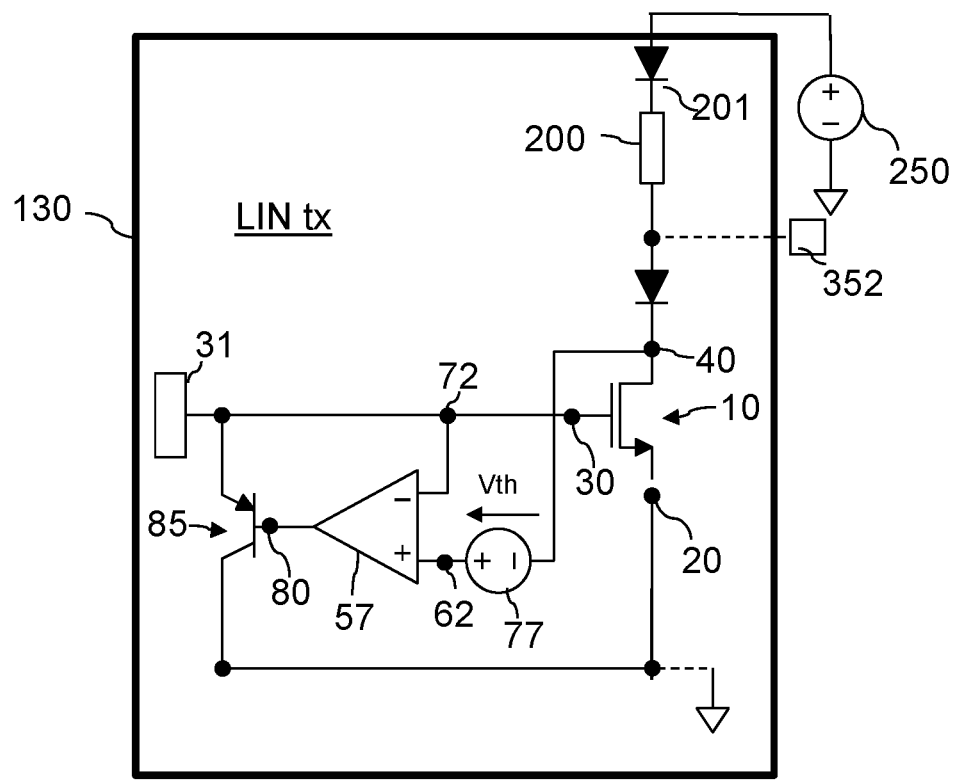

FIG. 4 schematically shows an equivalent circuit of a third example of a local interconnect (LIN) bus transceiver 130.

The LIN transceiver 130 differs from the LIN transceiver 120 in that it further includes a further switchable transistor 85. The amplifier output terminal 80 is electrically coupled to the transistor control terminal 30 via the further switchable transistor 85. The further switchable transistor 85 is part of the negative feedback loop including the amplifier 57, the second reference source 77 and the switchable transistor 10 and configured to establish operation of the loop, when the drive circuit 31 drives the LIN bus 352 into the dominant state via the switchable transistor 10. Correspondingly, when the drive circuit 31 drives the LIN bus into the recessive state the further switchable transistor 85 is switched off, thereby breaking the negative feedback loop. The further switchable transistor 85, clamps the transistor control terminal 30 and can be controlled by the amplifier 57 via the amplifier output 80.

As shown in FIG. 4, the further switchable transistor 85 is a pnp bipolar transistor. However, the further switchable transistor 85 can be a different type of transistor, for example a npn bipolar transistor, a MOSFET, a JEFET, a MESFET or any other type of suitable transistor.

The bipolar transistor 85 has a base terminal electrically connected to the amplifier output 80, a collector terminal electrically connected to the transistor reference terminal 20 and an emitter terminal electrically connected to the transistor control terminal. 30 The bipolar transistor 85 is a pnp transistor in which the base is formed with a n-type doped semiconductor material, the emitter is formed with a p-type doped semiconductor material and the collector is formed with p-type doped semiconductor material.

The bipolar transistor 85 is a non-linear component that cuts-off the loop formed by the amplifier 57 when the LIN bus transceiver 130 drives a recessive state on the LIN bus. In fact, when the transistor control terminal 30 is pulled down by the drive circuit 31 to a voltage level close to the ground, the bipolar transistor 85 is shut off by the amplifier 57 and no current can flow through it. When the transistor control terminal 30 is pulled-up by the drive circuit 31 and the switchable transistor 10 is turned on, i.e. in dominant state, the bipolar transistor 85 becomes active due to the amplifier 57. When activated, the bipolar transistor 85 is preferably kept in forward active region (saturation region for MOSFET transistor) such that a current can flow through it. In the latter case the loop around the switchable transistor 10 is established as described above.

It is to be noted that the further switchable transistor 85 may be used in the same manner in any topology shown through the FIGS. 1 to 3 to reach the same effect.

It is to be noted that the frequency response of the loop formed by the amplifiers 50, 55 or 57, the reference voltage source 77 for the embodiment of FIG. 3, the switchable transistor 10 and the second switchable transistor 85 can be tuned according to the requirement for the specific implementation.

The loop can be designed such it has no substantial effect on the transient behaviour of the switchable transistor 10 at switching frequencies of communication on the LIN bus while at the same time allowing relatively high suppression of switching noise at frequencies above the switching frequency.

In order to meet said requirements and to retain stability of the loop, a relatively low gain bandwidth product should be chosen. For example, depending on the specific application, the gain bandwidth product can be in a range between 50000 radiant per seconds to 1400000 radian per second. A lower gain bandwidth product improves switching noise suppression and stability but slows down response of the loop. A trade-off between speed response of the loop, noise suppression and stability can readily be found by those skilled in the art.

The amplifiers 55, 57 shown in FIGS. 2-4 and the first reference voltage source 75 shown in FIG. 2 and second reference voltage source 77 shown in FIGS. 3-4 can be implemented in any manner suitable for the specific implementation.

Figure 5:
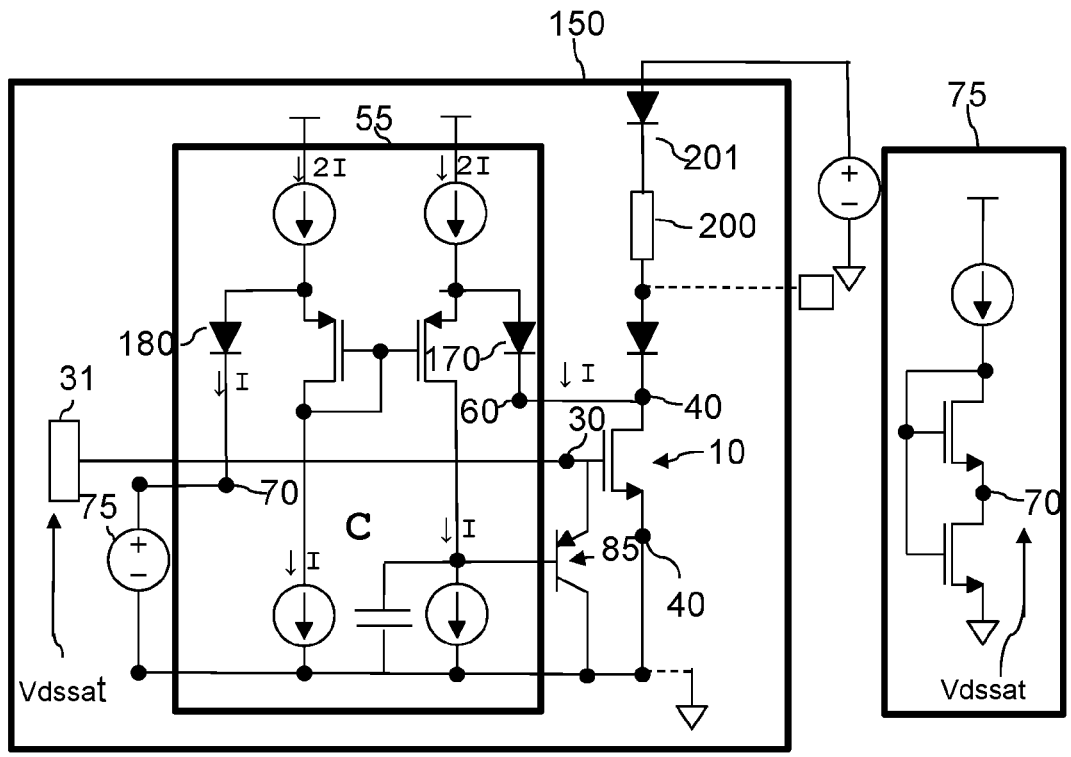

For example, FIG. 5 schematically shows an equivalent circuit of a fourth example of a local interconnect bus transceiver 150 where practical implementations of the amplifier 55 and the first reference voltage source 75 are also shown.

The first reference voltage source 75, shown on the right side of the FIG. 5, can be for example implemented by biasing with a current source two NMOS devices connected in series having a common gate terminal and of which the upper one has the gate and drain terminals short circuited. The NMOS with the gate and drain terminal short circuited has the drain source voltage equivalent to the threshold voltage Vth of the transistor. The voltage at the drain terminal of the lower NMOS device is equivalent to the gate to source voltage of the lower NMOS device minus the threshold voltage of the upper NMOS device, i.e. the voltage at the drain terminal of the lower NMOS device is equivalent to the transition mode threshold voltage Vdssat.

The amplifier 55 is, in the embodiment of FIG. 5, implemented as a differential current-mode amplifier having the amplifier first input 60 directly connected to the transistor output terminal 40 and the amplifier second input 70 electrically connected to a positive terminal of the first reference voltage source 75.

The differential current amplifier 55 is implemented with a PMOS current mirror having a differential input and a single output connected to the base of the pnp device 85. The differential current mirror is biased with two current references generating each a current equal to 2I and connected to the respective source terminals of the PMOS devices forming the current mirror. In a balanced operation, the current generated by the respective current references 2I is equally split in half at both branches of the current mirror between the respective PMOS device and the input branches connected via the diodes 170 and 180 to the respective first and second amplifier inputs 60 and 70. The PMOS current mirror senses a change of the output voltage at the transistor output terminal 40 and translates that into a current change. When the output voltage at the transistor output terminal 40 increases above the transition mode threshold voltage Vdssat, the current flowing through the diode 170 decreases and the current flowing through the PMOS device must increase such that the total current remains the same, i.e. 2I. In the latter situation, the pnp device 85 is controlled with a lower base to emitter voltage.

Further purpose of the components and operation of circuit shown on FIG. 5 are known to the skilled person and thus a detailed description is not included.

Figure 6:
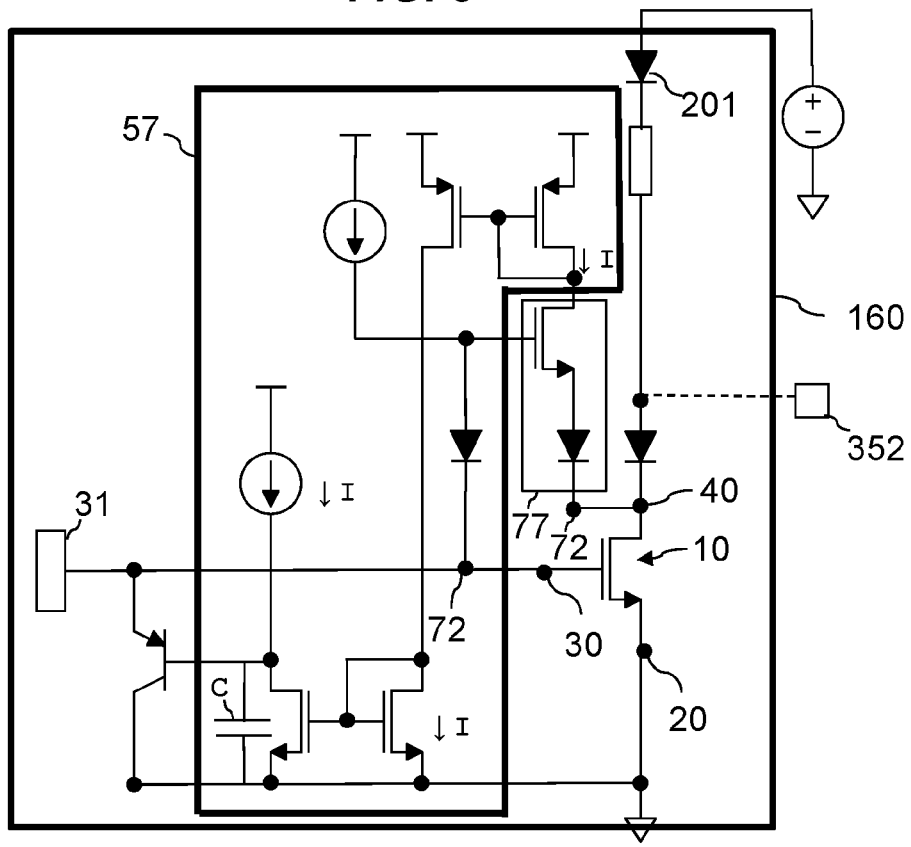

FIG. 6 schematically shows an equivalent circuit of a fifth example of a local interconnect bus transceiver 160 where practical circuit implementations of the amplifier 57 and the second reference voltage source 77 are also shown.

In this case the second reference voltage source 77 is implemented with an NMOS transistor, which is at the same time used to derive the differential input of the amplifier 57, as shown in FIG. 6. In fact, the gate voltage of the NMOS of the second reference voltage source 77 relates to the voltage at the transistor control terminal 30 and the source voltage of the NMOS of the second reference voltage source 77 relates to the voltage at the transistor output terminal 40. The NMOS of the second reference voltage source 77 starts to conduct current when a difference between its gate and source terminals, i.e. between the switchable transistor control and output terminals 30 and 40, exceeds the threshold voltage Vth. The NMOS is configured to be of the same type transistor as the switchable transistor 10 and hence they have nearly equivalent physical threshold voltage Vth. When the NMOS of the second reference voltage source 77 starts to conduct, the negative loop operation is established. Diodes between the NMOS and the switchable transistor 10 are required to prevent undesired conduction at recessive state on the LIN bus 352. Other aspects of circuit, shown on FIG. 6, are known to the skilled and further description on the operation of the circuit is not required for the understanding of the principle of the invention.

Figure 7:
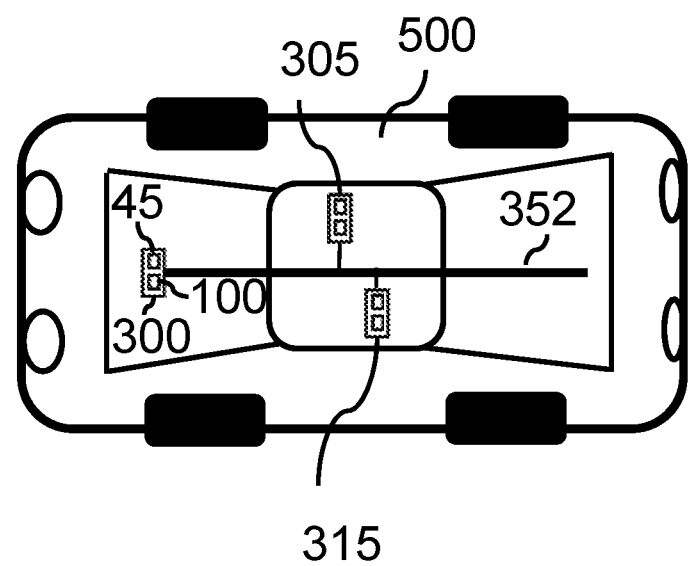

FIG. 7 schematically shows an example of automotive vehicle 500. The automotive vehicle 500 includes a LIN bus 352 and one or more integrated circuits 300, 305, 315 connected to the LIN bus 352. The integrated circuit 300 includes the LIN bus transceiver 100 and one or more switching circuit 45 described with reference to FIG. 1. However, the integrated circuits 300, 305, 315 can e.g. include any of the LIN bus transceivers 100-160 described with reference to the FIGS. 1-6 and can be embedded in a device package as described above. The integrated circuits 300, 305, 315 can include additional one or more switching circuits having a reference terminal connected to the reference terminal of the switchable transistor (not shown in FIG. 7). The integrated circuits 300, 305 and 315 are configured to receive and/or transmit data via the LIN bus 352. Propagation of any noise, generated by the switching circuits, can be reduced in the integrated circuits 300, 305 and 315 by activating the negative feedback loop described with reference to the LIN bus transceivers 100-160. As a consequence, the integrated circuits 300, 305, 315 can have a smaller footprint than conventional integrated circuits because e.g. the reference terminal of the LIN bus transceiver 100 does not need to be separated from the reference terminal of the switching circuit 45 as in conventional solutions which would require an additional ground terminal in the package of the convention integrated circuit.

In the foregoing specification, the invention has been described with reference to specific examples of embodiments of the invention. It will, however, be evident that various modifications and changes may be made therein without departing from the scope of the invention as set forth in the appended claims.

All embodiments provide a noise suppression circuit for a switchable transistor comprising a transistor control terminal, a transistor output terminal and a transistor reference terminal. The noise suppression circuit comprises the switchable transistor, and an amplifier. The amplifier comprises a first amplifier input terminal electrically coupled to the transistor output terminal, an amplifier output terminal electrically coupled to the transistor control terminal. The amplifier is configured to sense a voltage at the transistor output terminal, output a control voltage to the transistor control terminal, and, based on the sensed voltage and a transition mode threshold voltage defining a transition between operational modes of the switchable transistor, set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor said resistive path is substantially interrupted.

The connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the embodiments of the present invention is, for the most part, composed of electronic components and circuits known to those skilled in the art, circuit details have not been explained in any greater extent than that considered necessary, for the understanding and appreciation of the underlying concepts of the embodiments of the present invention and in order not to obfuscate or distract from the teachings of the embodiments of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein

The invention claimed is:

1. A noise suppression circuit comprising:
a switchable transistor comprising a transistor control terminal, a transistor output terminal, and a transistor reference terminal;
an amplifier comprising
a first amplifier input terminal electrically coupled to the transistor output terminal, and
an amplifier output terminal electrically coupled to the transistor control terminal, wherein the amplifier is configured to
sense a voltage at the transistor output terminal,
output a control voltage to the transistor control terminal, and,
based on the sensed voltage and a transition mode threshold voltage defining a transition between operational modes of the switchable transistor, set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor said resistive path is substantially interrupted; and
a reference voltage source configured to generate a voltage substantially equal or lower than a physical threshold voltage of the switchable transistor, wherein
the first amplifier input terminal is electrically coupled to the transistor output terminal via the reference voltage source,
the amplifier has a second amplifier input directly electrically connected to the transistor control terminal, and
the transition mode threshold voltage depends on the physical threshold voltage of the switchable transistor.

2. The circuit as claimed in claim 1, wherein A noise suppression circuit comprising:
a switchable transistor comprising a transistor control terminal, a transistor output terminal, and a transistor reference terminal;
an amplifier comprising
a first amplifier input terminal electrically coupled to the transistor output terminal, and
an amplifier output terminal electrically coupled to the transistor control terminal, wherein the amplifier is configured to
sense a voltage at the transistor output terminal,
output a control voltage to the transistor control terminal, and,
based on the sensed voltage and a transition mode threshold voltage defining a transition between operational modes of the switchable transistor, set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor said resistive path is substantially interrupted; and
a further switchable transistor, wherein
the amplifier output terminal is coupled to the control terminal via the further switchable transistor, and
the further switchable transistor is configured to allow operation of the amplifier when said switchable transistor is switched on.

3. The circuit as claimed in claim 2, wherein
the further switchable transistor has a further control terminal connected to the amplifier output terminal, a further output terminal connected to the control terminal of the switchable transistor and a further reference terminal connected to the reference terminal of the switchable transistor.

4. The circuit as claimed in claim 2, wherein
the amplifier is implemented as one of: an operational amplifier, operational transconductance amplifier, current amplifier, voltage amplifier, or transimpedance amplifier.

5. A local interconnect bus transceiver for driving a bus comprising:
a noise suppression circuit for a switchable transistor, wherein the noise suppression circuit comprises:

the switchable transistor having a control terminal, an output terminal electrically coupled to the bus for driving the bus, and a reference terminal, an amplifier comprising
a first amplifier input terminal electrically coupled to the transistor output terminal,
an amplifier output terminal electrically coupled to the transistor control terminal, wherein the amplifier is configured to
sense a voltage at the transistor output terminal,
output a control voltage to the transistor control terminal, and,
based on the sensed voltage and a transition mode threshold voltage defining a transition between operational modes of the switchable transistor, set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor said resistive path is substantially interrupted; and
a drive circuit configured to drive the switchable transistor into an on or off state.

6. The local interconnect bus transceiver as claimed in claim 5, wherein
the circuit further comprises a first reference voltage source configured to generate the transition mode threshold voltage;
the first amplifier input terminal is directly electrically connected to the transistor output terminal; and
the amplifier has a second amplifier input coupled to the transistor reference terminal via the first reference voltage source.

7. The local interconnect bus transceiver as claimed in claim 6, wherein
the amplifier, the switchable transistor and the first reference voltage source form a negative feedback loop configured to have a dominant frequency pole such to reduce any noise propagating via the switchable transistor in a predetermined noise frequency range and to allow the drive circuit to switch on and off the switchable transistor up to a maximum switchable frequency.

8. The local interconnect bus transceiver as claimed in claim 5, wherein the circuit further comprises:
a reference voltage source configured to generate a voltage substantially equal to a physical threshold voltage of the switchable transistor, wherein
the first amplifier input terminal is electrically coupled to the transistor output terminal via the second reference voltage source,
the amplifier has a second amplifier input directly electrically connected to the transistor control terminal, and
the transition mode threshold voltage depends on the physical threshold voltage of the switchable transistor.

9. The local interconnect bus transceiver as claimed in claim 8, wherein
the amplifier and the switchable transistor form a negative feedback loop configured to have a dominant frequency pole such to reduce any noise propagating via the switchable transistor in a predetermined noise frequency range and to allow the drive circuit to switch on and off the switchable transistor up to a maximum switchable frequency.

10. The local interconnect bus transceiver as claimed in claim 5, wherein the first amplifier input is directly electrically coupled to the bus.

11. The local interconnect bus transceiver as claimed in claim 5, wherein the drive circuit is configured to switch on the switchable transistor and the noise suppression circuit is configured to be operative when the switchable transistor is switched on.

12. The local interconnect bus transceiver as claimed in claim 5, wherein
the switchable transistor is one of the group of transistors consisting of: metal-oxide-semiconductor field effect transistor, Metal-Semiconductor Field Effect transistor, junction effect field effect transistor, High electron mobility transistor, Insulated Gate Field effect Transistor, a hetero-junction bipolar transistor, and junction bipolar transistor.

13. The local interconnect bus transceiver as claimed in claim 5, further comprising a further switchable transistor, wherein
the amplifier output terminal is electrically coupled to the transistor control terminal via the further switchable transistor, and the further switchable transistor is configured to allow operation of the amplifier when the drive circuit switches on the switchable transistor.

14. The local interconnect bus transceiver as claimed in claim 13, wherein
the further switchable transistor has a further control terminal electrically connected to the amplifier output terminal, a further output terminal electrically connected to the control terminal of the switchable transistor and a further reference terminal electrically connected to the reference terminal of the switchable transistor.

15. An integrated circuit comprising
a local interconnect bus transceiver for driving a bus comprising
a noise suppression circuit for a switchable transistor, wherein the noise suppression circuit comprises:
the switchable transistor having a control terminal, an output terminal electrically coupled to the bus for driving the bus and a reference terminal, and
an amplifier comprising
a first amplifier input terminal electrically coupled to the transistor output terminal,
an amplifier output terminal electrically coupled to the transistor control terminal, wherein the amplifier is configured to
sense a voltage at the transistor output terminal,
output a control voltage to the transistor control terminal, and,
based on the sensed voltage and a transition mode threshold voltage defining a transition between operational modes of the switchable transistor, set the voltage at the transistor output terminal to at least the transition mode threshold voltage such that for noise frequencies below or corresponding to the switching frequency of the switchable transistor a resistive path is provided between the transistor output terminal and the transistor reference terminal and for noise frequencies above the switching frequency of the switchable transistor said resistive path is substantially interrupted;

a drive circuit for driving the switchable transistor into an on and off state; and one or more switching circuitry having a reference terminal electrically connected to the reference terminal of the switchable transistor; wherein the noise suppression circuit is configured to suppress noise generated from the one or more switching circuitry and propagating via the switchable transistor to the bus when the drive circuit switches on the switchable transistor.

16. The integrated circuit as claimed in claim 15, wherein the noise suppression circuit is configured to suppress noise within a predetermined noise frequency range.

17. An integrated circuit device comprising the integrated circuit as claimed in claim 15;

a first electrically conductive terminal for supplying the local interconnect bus transceiver with a battery external to the integrated circuit device, a second electrically conductive terminal for electrically connecting the interconnect local network transceiver to the bus, and a third electrically conductive terminal for electrically connecting the reference terminal of the switchable transistor to a reference potential, wherein the first electrically conductive terminal, the second electrically conductive terminal and the third electrically conductive terminal are electrically coupled to respective integrated circuit terminals via associated electrically conductive elements.

18. An automotive vehicle comprising a bus wire and one or more integrated circuits as claimed in claim 15, wherein the one or more local interconnect bus transceivers of the respective one or more integrated circuits are configured to receive and/or transmit data via the bus.

* * * * *